(12) United States Patent
Lu (10) Patent No.: US 12,360,423 B2
(45) Date of Patent: Jul. 15, 2025

(54) ARRAY SUBSTRATE AND TOUCH DISPLAY PANEL

(71) Applicant: TCL CHINA STAR OPTOELECTRONICS TECHNOLOGY CO., LTD., Guangdong (CN)

(72) Inventor: Zhitao Lu, Guangdong (CN)

(73) Assignee: TCL CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 18/068,747

(22) Filed: Dec. 20, 2022

(65) Prior Publication Data

US 2024/0069391 A1    Feb. 29, 2024

(30) Foreign Application Priority Data

Aug. 30, 2022   (CN) .......................... 202211049299.0

(51) Int. Cl.

| G02F 1/1343 | (2006.01) |
| G02F 1/1333 | (2006.01) |
| G02F 1/1362 | (2006.01) |
| G06F 3/041 | (2006.01) |
| G06F 3/044 | (2006.01) |
| H10D 86/40 | (2025.01) |
| H10D 86/60 | (2025.01) |

(52) U.S. Cl.
CPC .... *G02F 1/134345* (2021.01); *G02F 1/13338* (2013.01); *G02F 1/136286* (2013.01); *G06F 3/0412* (2013.01); *G06F 3/044* (2013.01); *H10D 86/481* (2025.01); *H10D 86/60* (2025.01); *G02F 1/13439* (2013.01); *H10D 86/441* (2025.01)

(58) Field of Classification Search
None
See application file for complete search history.

(56) References Cited

U.S. PATENT DOCUMENTS

| 2009/0079892 | A1* | 3/2009 | Hsien | G02F 1/133707 |
| | | | | 349/47 |
| 2013/0077002 | A1* | 3/2013 | Yoon | G02F 1/136213 |
| | | | | 349/38 |
| 2014/0253835 | A1* | 9/2014 | Li | G02F 1/1343 |
| | | | | 349/42 |
| 2016/0246092 | A1* | 8/2016 | Huang | G02F 1/136286 |
| 2018/0090544 | A1* | 3/2018 | Gunji | H10K 50/81 |
| 2018/0107040 | A1* | 4/2018 | Yeh | G02F 1/1393 |
| 2019/0018294 | A1* | 1/2019 | Shi | G02F 1/136286 |
| 2021/0200367 | A1* | 7/2021 | Lee | G06F 3/0448 |

* cited by examiner

*Primary Examiner* — Christopher R Lamb (57) ABSTRACT

An array substrate and a touch display panel are provided. The array substrate includes a substrate, a pixel unit, a pixel electrode, and a capacitor electrode. An orthographic projection of the capacitor electrode on the substrate at least partially overlaps an orthographic projection of a subpixel electrode on the substrate. By arranging the capacitor electrode in a subpixel area and by making a capacitance value of a storage capacitor corresponding to the subpixel electrode greater than a capacitance value of a storage capacitor corresponding to a main pixel electrode and a common electrode, touch effects of a display panel can be improved.

15 Claims, 5 Drawing Sheets

ARRAY SUBSTRATE AND TOUCH DISPLAY PANEL

CROSS REFERENCE TO RELATED APPLICATIONS

This application claims priority to China Patent Application No. 202211049299.0, filed Aug. 30, 2022, the disclosure of which is incorporated herein by reference in its entirety.

BACKGROUND OF INVENTION

1. Field of Invention

The present invention relates to a technical field of design and manufacture of displays, and particularly to an array substrate and a touch display panel.

2. Related Art

With development of display technologies such as manufacturing process of display panels, people have put forward higher requirements for performance and quality of display panels and devices.

Figure 1:
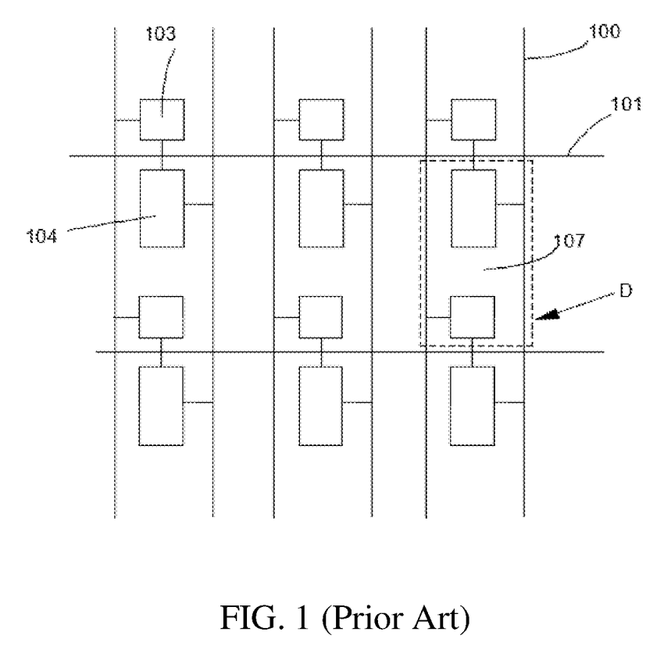
FIG. 1 is an overall structural view of a pixel circuit corresponding to a multi-domain display panel in prior art.
Figure 2:
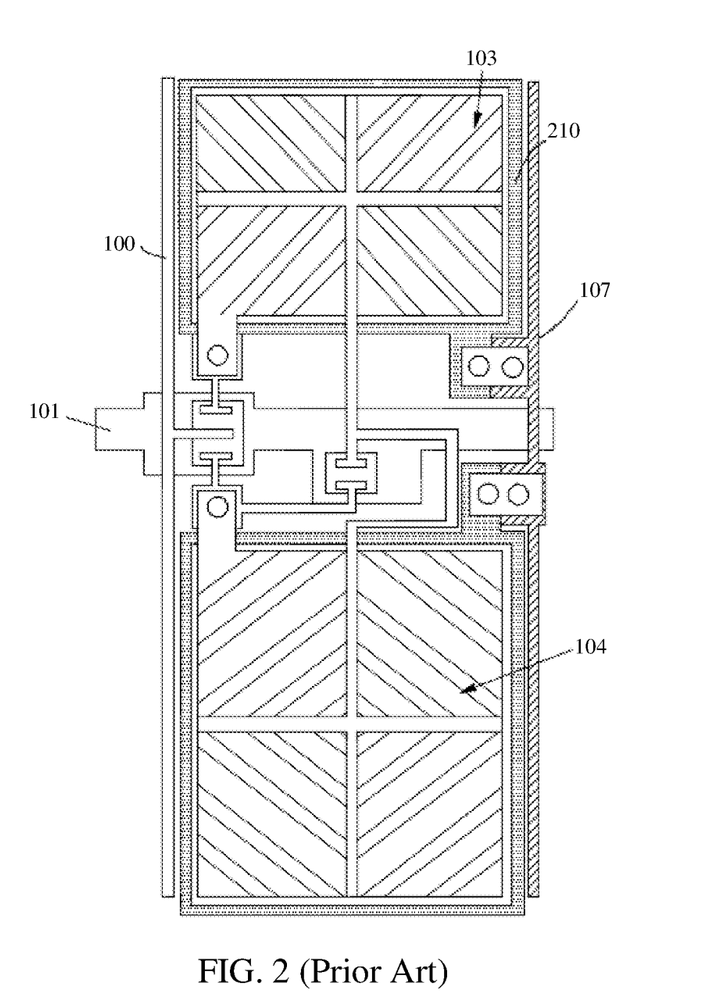
FIG. 2 is a schematic cross-sectional view of a wiring structure of a corresponding circuit in FIG. 1.

Among various display devices, touch panels are used in various display fields because they can be directly operated by touch on screens. In large-sized display panels, due to large number of corresponding touch sensing units, arrangements between touch signal lines and pixel electrodes and other functional electrodes inside each pixel unit are problematic. When performing touch control, because touch areas are small, aperture ratios of corresponding pixel units are low, and touch transmittance is low, touch sensitivity and touch effects of touch panels are reduced, as illustrated in FIG. 1, showing an overall structural view of a pixel circuit corresponding to a multi-domain display panel in prior art. A plurality of pixel units are included in display areas of the display panel, and the pixel units are arranged in an array, such as an M×N array. Each of the pixel units is divided into a main pixel area 103 and a subpixel area 104, a scan signal line 101 is disposed corresponding to each row of subpixels, and a data signal line 100 is disposed corresponding to each column of the subpixels. The scan signal line 101 and the data signal line 100 are electrically connected to each subpixel and provide scan signals and data signals to the main pixel area 103 and the subpixel area 104 of the subpixel. FIG. 2 is an enlarged schematic diagram of a detailed structure in a corresponding area D in FIG. 1. When touch signal lines 107 are disposed on a display panel, the touch signal lines 107 are generally disposed at edge positions of each of the main pixel areas 103 and the subpixel areas 104, and are electrically connected to corresponding common electrodes 210. Therefore, in the corresponding 3T and 3T+ thin-film transistor driving circuit structures in FIG. 2, the additional disposition of touch signal lines 107 will further increase the complexity of the connection relationship between the lines, which makes it easy to cause interference between different electrodes and signal lines, thereby adversely affecting touch precision and touch effects of the display panel.

To sum up, touch panels prepared in prior art are complex in structure. When performing touch operations on touch panels, the touch precision is not ideal, thus affecting the touch precision and touch sensitivity of display panels, which is not conducive to improvement of comprehensive performance of the touch panels.

SUMMARY OF INVENTION

An object of the present invention is to provide an array substrate and a touch display panel to effectively improve a layout structure of each electrode inside the touch display panel, which in turn improves touch sensitivity and touch effects of the touch display panel and effectively enhances comprehensive performance of the touch display panel.

In order to achieve the above-mentioned object, the embodiments of the present invention provide technical solutions as follows:

In a first aspect of the embodiments of the present invention, an array substrate is provided and includes a substrate, a pixel unit disposed on the substrate and including a main pixel area, a subpixel area, a pixel electrode, a capacitor electrode, and a common electrode. The main pixel area is arranged on at least one side of the subpixel area.

The pixel electrode includes a main pixel electrode and a subpixel electrode. The main pixel electrode is disposed in the main pixel area, and the subpixel electrode is disposed in the subpixel area. A touch signal line is disposed in the main pixel area and the subpixel area and is electrically connected to the capacitor electrode and the common electrode.

Specifically, the capacitor electrode is arranged in the subpixel area, the common electrode is arranged in the main pixel area, an orthographic projection of the capacitor electrode on the substrate at least partially overlaps an orthographic projection of the subpixel electrode on the substrate, and a capacitance value of a storage capacitor corresponding to the subpixel electrode and the capacitor electrode is greater than a capacitance value of a storage capacitor corresponding to the main pixel electrode and the common electrode.

According to one embodiment of the present invention, an area of the orthographic projection of the capacitor electrode on the substrate is greater than an area of the orthographic projection of the subpixel electrode in the subpixel area on the substrate.

According to one embodiment of the present invention, an overlapping area between the capacitor electrode and the subpixel electrode is greater than an overlapping area between the main pixel electrode and the common electrode.

According to one embodiment of the present invention, each of the main pixel electrode and the subpixel electrode has a patterned configuration.

According to one embodiment of the present invention, the capacitor electrode has a patterned configuration, which is different from that of the subpixel electrode.

According to one embodiment of the present invention, the capacitor electrode includes a plurality of first slits, the subpixel electrode includes a plurality of second slits, and at least some of the first slits are misaligned with the second slits.

According to one embodiment of the present invention, the capacitor electrode includes a first electrode plate and a second electrode plate disposed on a side of the first electrode plate, and the first electrode plate and the second electrode plate are symmetrically arranged relative to a central axis of the subpixel area.

According to one embodiment of the present invention, the first electrode plate receives a first voltage signal, and the second electrode plate receives a second voltage signal, and the first voltage signal is same as the second voltage signal.

According to one embodiment of the present invention, the touch signal line is located on a side of the data signal line and is correspondingly disposed on a central axis of the main pixel area and the central axis of the subpixel area.

According to one embodiment of the present invention, the pixel unit further includes a plurality of scan signal lines arranged in a first direction, and a plurality of data signal lines arranged in a second direction intersecting the first direction.

Specifically, the main pixel area and the subpixel area are correspondingly arranged on both sides of each of the scan signal lines.

According to one embodiment of the present invention, the common electrode is arranged around the main pixel electrode.

According to one embodiment of the present invention, the touch signal line and a source electrode and a drain electrode included in a thin-film transistor are disposed in a same layer.

According to one embodiment of the present invention, the capacitor electrode and a gate included in the thin-film transistor are disposed in a same layer.

According to a second aspect of the embodiments of the present invention, a touch display panel is further provided.

The touch display panel includes an array substrate, and a touch layer disposed on the array substrate. Specifically, the array substrate is the array substrate provided in the embodiment of the present invention, and each electrode on the array substrate is arranged according to the structure provided in the embodiment of the present invention, so as to improve the touch performance and effect of the touch display panel.

The embodiments of the present invention have advantageous effects as follows:

The embodiments of the present invention provide the array substrate and the touch display panel. The array substrate includes the substrate, the pixel unit, the pixel electrode, the capacitor electrode, and the touch signal line. Specifically, the pixel unit includes the main pixel area and the subpixel area. The pixel electrode includes the main pixel electrode and the subpixel electrode, and the capacitor electrode is arranged in the subpixel area of the pixel unit. The orthographic projection of the capacitor electrode and the orthographic projection of the subpixel electrode on the substrate in the subpixel area at least partially overlap. In this invention, by arranging the capacitor electrode in the subpixel area of the pixel unit and by making the overlapping area between the capacitor electrode and the subpixel electrode larger than the overlapping area between the main pixel electrode and the common electrode in the main pixel area, the capacitance values of the storage capacitors formed between different electrodes are changed. When the touch display panel is touched, the touch effect is effectively improved and the overall performance of the touch panel is enhanced.

BRIEF DESCRIPTION OF DRAWINGS

The technical solutions and other advantageous effects of the present invention will be apparent through the detailed description of the specific embodiments of the present invention in conjunction with the accompanying drawings.

DESCRIPTION OF PREFERRED EMBODIMENTS

The following disclosure provides different implementations or examples to implement different structures of the present invention with reference to the accompanying drawings in the embodiments of the present invention. To simplify the present invention, the components and arrangements of specific examples are described below. In addition, this invention provides examples of various specific processes and materials, and those of ordinary skill in the art will recognize the application of other processes. All other embodiments obtained by those skilled in the art without creative work shall fall within the protection scope of this invention.

In the description of the present invention, it is to be understood that the term "center", "longitudinal", "lateral", "length", "width", "thickness", "upper", "lower", "front", "rear", "left", "right", "vertical", "horizontal", "top", "bottom", "inner", "outer", "clockwise", "counterclockwise" indicates orientation or the orientation or positional relationship based on the positional relationship shown in the drawings, for convenience of description only and the present application is to simplify the description, but does not indicate or imply that the device or element referred to must have a particular orientation in a particular orientation construction and operation, and therefore not be construed as limiting the present application. In addition, the terms "first" and "second" are only used for descriptive purposes and are not to be construed as indicating or implying relative importance.

Figure 3:
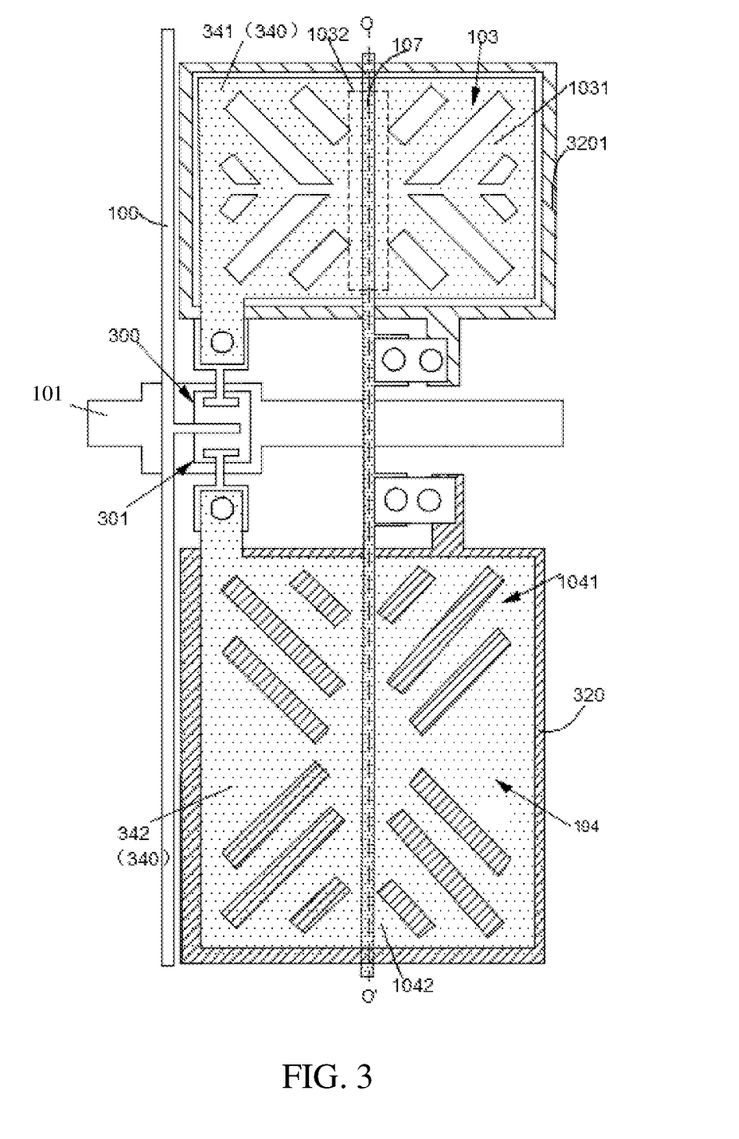
FIG. 3 is a schematic cross-sectional view of a wiring structure of an array substrate according to one embodiment of the present invention.

As shown in FIG. 3, FIG. 3 is a schematic cross-sectional view of a wiring structure of an array substrate according to one embodiment of the present invention. In the embodiment of the present invention, an array substrate is provided. Specifically, the array substrate includes a substrate, various devices and corresponding circuits arranged on the substrate. A plurality of pixel units are disposed on the substrate and arranged in an array. In the embodiment of the present invention, a main pixel area 103 and a subpixel area 104 corresponding to one pixel unit are taken as an example for description. Specifically, the main pixel area 103 is located on one side of the subpixel area 104.

Furthermore, the substrate is provided with scan signal lines 101 and data signal lines 100. Specifically, the scan signal lines 101 and the data signal lines 100 are arranged in row and column directions on the substrate. For example, the scan signal lines 101 are arranged in a first direction, and the data signal lines 100 are arranged in a second direction.

In this case, the first direction is corresponding a row direction in which the pixel units are arranged, and the second direction is corresponding to a column direction in which the pixel units are arranged. Therefore, the scan signal lines 101 and the data signal lines 100 are interlaced to form a plurality of pixel areas. In addition, the scan signal lines 101 and the data signal lines 100 are configured to provide scan signals and data signals for a display panel. In the embodiment of the present invention, the main pixel area 103 and the subpixel area 104 are disposed on both sides of each of the scan signal lines 101, respectively.

Further, in the embodiment of the present invention, a thin-film transistor is also correspondingly arranged in each pixel unit. Preferably, in the main pixel area 103, a first thin-film transistor 300 is disposed correspondingly, and in the subpixel area 104, a second thin-film transistor 301 is disposed correspondingly. Specifically, a gate of the first thin-film transistor 300 is electrically connected to a gate of the second thin-film transistor 301. The gate of the first thin-film transistor 300 and the gate of the second thin-film transistor 301 are electrically connected to the scan signal lines 101, so as to provide gate driving signals to the scan signal lines 101.

In addition, the array substrate further includes a plurality of pixel electrodes 340. In the embodiment of the present application, each of the pixel electrodes 340 includes a main pixel electrode 341 and a subpixel electrode 342. Specifically, the main pixel electrode 341 is correspondingly disposed in the main pixel area 103, and the subpixel electrode 342 is correspondingly disposed in the subpixel area 104. In addition, the main pixel electrode 341 and the subpixel electrode 342 are electrically connected to the thin-film transistor on corresponding sides of the thin-film transistor.

Further, as shown in FIG. 3, in the embodiment of the present invention, when setting the corresponding pixel electrodes in the main pixel area 103 and the subpixel area 104 in the display panel, the main pixel electrode 341 in the main pixel area 103 and the subpixel electrode 342 in the subpixel area 104 are being patterned, respectively. When being patterned, a plurality of rectangular slits or a slit structure of other shapes can be formed in the main pixel electrode 341. The slits can be symmetrically arranged relative to a central axis of the main pixel electrode 341 and be formed with a patterned configuration eventually.

Specifically, in the main pixel area 103, the main pixel electrode 341 includes a first trunk electrode 1032 and a first branch electrode 1031. In the subpixel area 104, the subpixel electrode 342 includes a second trunk electrode 1042 and a second branch electrode 1041.

In this embodiment, when the electrodes in the main pixel area 103 and the subpixel area 104 are arranged according to the above-mentioned electrode pattern, the main pixel area 103 is divided into four display domains by the main pixel electrode, and the subpixel area 104 is divided into four display domains by the subpixel electrode. Therefore, each pixel unit includes eight display domains.

Further, the array substrate provided in the embodiment of the present invention further includes a plurality of capacitor electrodes 320. Each of the capacitor electrodes 320 is disposed in corresponding one of the subpixel areas 104 of the pixel units. In addition, in the subpixel area 104, an orthographic projection of the capacitor electrode 320 on the substrate and an orthographic projection of the subpixel electrode 342 in the subpixel area 104 on the substrate at least partially overlap.

Furthermore, in the embodiment of the present invention, a common electrode 3201 is disposed in the main pixel area 103 of the pixel unit. Specifically, the common electrode 3201 is disposed on peripheral sides of the main pixel electrode 341. For example, the common electrode 3201 is arranged around the main pixel electrode 341 in the main pixel area 103. In the embodiment of the present application, a storage capacitor is formed between the common electrode 3201 and the main pixel electrode 341, so that a voltage or potential in the display panel is controlled through the above-mentioned capacitor, thus ensuring the normal operation of the display panel.

In the embodiment of the present invention, the capacitor electrode 320 is disposed in the subpixel area 104. Specifically, a projection of the capacitor electrode 320 and a projection of the subpixel electrode 342 in the subpixel area 104 on a same substrate at least partially overlap. Preferably, in the embodiment of the present application, the above-mentioned projections may be an orthographic projection of the capacitor electrode 320 and an orthographic projection of the subpixel electrode 342 in the subpixel area 104 on the same substrate. In addition, an area of the orthographic projection of the capacitor electrode 320 is greater than an area of the orthographic projection of the subpixel electrode 342 in the subpixel area 104. In this way, an area where the capacitor electrode 320 and the pixel electrode overlap is effectively increased. Since the capacitor electrode 320 and the subpixel electrode 340 collectively form a capacitor structure in the overlapping area, and no overlapping area is created between the capacitor electrode and the common electrode in the main pixel area, a difference exists between capacitance values corresponding to the main pixel area and the subpixel area of the corresponding pixel unit. In the embodiment of the present invention, a capacitance value of the storage capacitor between the subpixel electrode 342 and the capacitor electrode 320 is greater than a capacitance value of the storage capacitor between the main pixel electrode 341 and the common electrode 3201. That is, the overlapping area between the subpixel electrode 342 and the capacitor electrode 320 is larger than the overlapping area between the main pixel electrode 341 and the common electrode 3201. When charging pixel units in different pixel areas, since the capacitance value of the storage capacitor in the subpixel area is greater than the capacitance value of the storage capacitor in the main pixel area, a charging rate of the pixel unit in the subpixel area is lower, so that there are different charging rates in two different pixel areas. Therefore, the present application achieves the purpose of improving the performance of the display panel by changing a capacitance structure and a size of the capacitance value.

Specifically, when disposing the capacitor electrode 320, the capacitor electrode 320 may be located at a position below the subpixel electrode 342 in the subpixel area 104.

Further, in the embodiment of the present application, each of the subpixel electrode 342 and the capacitor electrode 320 can be formed with a patterned configuration. When being patterned, an electrode pattern of the capacitor electrode 320 may be different from an electrode pattern of the subpixel electrode 342. Specifically, the electrode pattern of the subpixel electrode 342 is shown in the schematic structural view in FIG. 3. Preferably, the subpixel electrode 342 and the capacitor electrode 320 can also be configured as electrode patterns of other shapes, which will not be repeated here.

Figure 4:
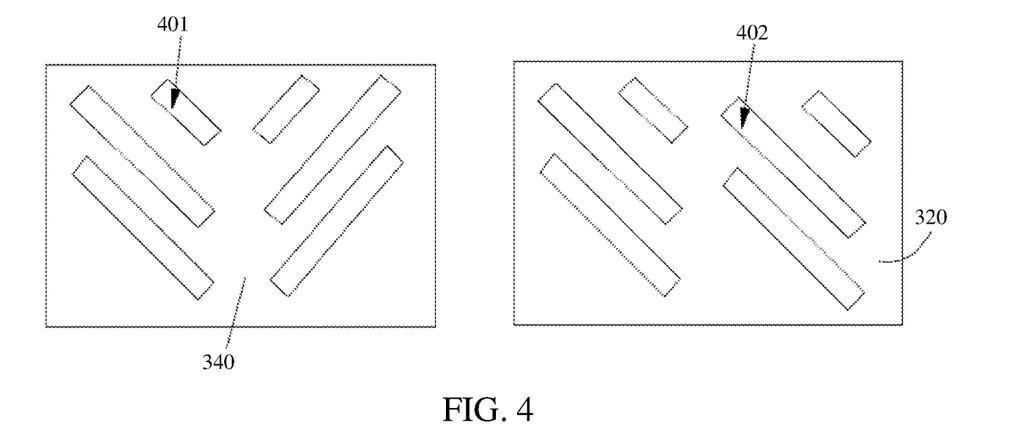
FIG. 4 is a schematic view of patterned configurations of a pixel electrode and a capacitor electrode according to an embodiment of the present invention.

Preferably, as shown in FIG. 4, FIG. 4 is a schematic view of patterned configurations of a pixel electrode and a capacitor electrode according to an embodiment of the present invention. On the patterned pixel electrode 340, a plurality of first slits 401 are formed, and on the patterned capacitor electrode 320, a plurality of second slits 402 are formed. In the embodiment of the present invention, at least some of the second slits 402 of the capacitor electrode 320 in the subpixel area and some of the first slits 401 of the subpixel electrode 342 in the subpixel area may not overlap, that is, they are misaligned with each other. For example, some of the second slits 402 on a right part of the capacitor electrode 320 relative to the central axis of the subpixel area are oriented toward a direction different from a direction where some of the first slits 401 on a right part of the subpixel electrode 342 relative to the central axis of the subpixel area, thus ensuring a relatively large opposing area between the capacitor electrode 320 and the subpixel electrode 342.

Figure 5:
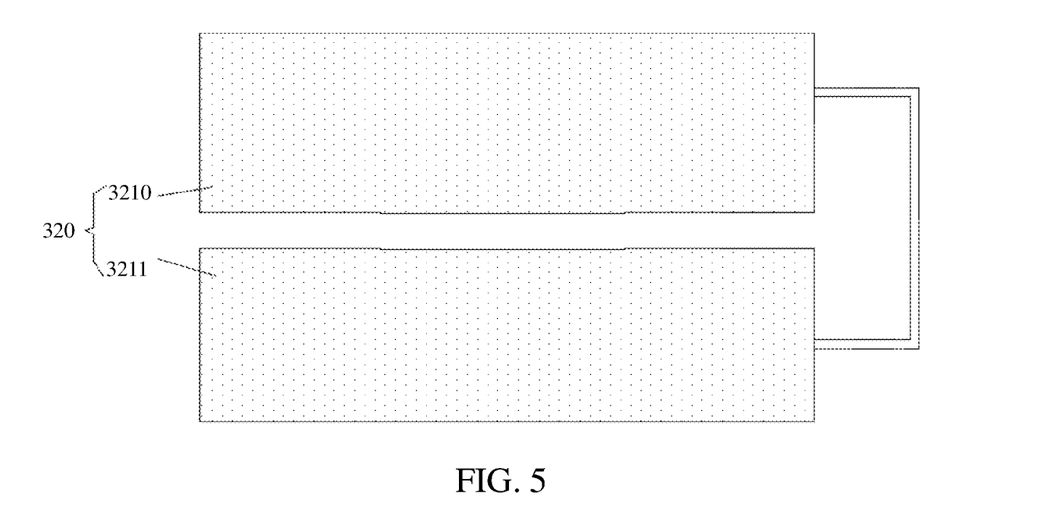
FIG. 5 is a schematic structural view of another capacitor electrode according to an embodiment of the present invention.

Further, when configuring the capacitor electrode in the embodiment of the present invention, the capacitor electrode can also be disposed separately. Specifically, as shown in FIG. 5, FIG. 5 is a schematic structural view of another capacitor electrode according to an embodiment of the present invention. The capacitor electrode 320 may further include a first electrode plate 3210 and a second electrode plate 3211. The first electrode plate 3210 is disposed on a side of the second electrode plate 3211, and a certain distance is formed between the first electrode plate 3210 and the second electrode plate 3211. In the embodiment of the present invention, it can be ensured that shapes and area of the first electrode plate 3210 and the second electrode plate 3211 are the same. In addition, the first electrode plate 3210 and the second electrode plate 3211 are symmetrically arranged relative to the central axis of the subpixel area. This not only ensures that the capacitor electrode and the pixel electrode have a large overlapping area, but also ensures better consistency. In addition, the size of the first electrode plate 3210 and the second electrode plate 3211 can be set according to the size of the subpixel area, respectively, in order to better match the capacitor electrode with the pixel electrode and ensure the performance of a touch display panel.

In the embodiment of the present invention, as shown in FIG. 5, the first electrode plate 3210 and the second electrode plate 3211 can be electrically connected to each other through connecting wires on corresponding sides, respectively. Further, the above-mentioned first electrode plate 3210 and second electrode plate 3211 can also be disposed independently relative to each other. That is, the first electrode plate 3210 can receive a first voltage signal, and the second electrode plate 3211 can receive a second voltage signal. When applying voltages to different capacitor electrodes, the first voltage signal is connected to the first electrode plate 3210, and the second voltage signal is connected to the second electrode plate 3211. Therefore, different control signals can be applied to different capacitor electrodes. Preferably, in the embodiment of the present application, the first voltage signal and the second voltage signal are set to be a same voltage signal to ensure the consistency of their effects on the display panel.

In addition, when setting different electrodes in the subpixel area 104 and the main pixel area 103, the overlapping area between the capacitor electrode 320 and the subpixel electrode 342 in the subpixel area 104 is set to be larger than the overlapping area between the common electrode 3201 and the main pixel electrode 341 in the main pixel area 103. In this case, since the overlapping areas between different electrodes are different in different pixel areas, a capacitance value of the storage capacitor in the subpixel area 104 is greater than a capacitance value of the storage capacitor in the main pixel area 103.

That is, in the embodiment of the present invention, the capacitance values in different pixel areas can be adjusted, so that charging rates of thin-film transistors in corresponding pixel areas are different. Specifically, in the subpixel area 104, due to the additional capacitor electrode, a corresponding capacitance value is made greater, and the capacitor electrode can double as a common electrode. Therefore, a charging rate of the second thin-film transistor 301 is relatively low. On the contrary, in the main pixel area 103, a corresponding capacitance value is relatively small, so a charging rate of the first thin-film transistor 300 is relatively high. Therefore, the embodiment of the present invention achieves a purpose of improving display viewing angles and providing the display effects by changing the charging rates of the thin-film transistors in different pixel areas.

In addition, in the embodiment of the present invention, since the capacitor electrode 320 is configured with a relatively large size, when an upper film is touched, an inductive capacitance formed between the upper film and a finger will also increase, thereby further improving the touch effect of the touch display panel.

Further, in the embodiment of the present invention, the array substrate further includes a touch signal line 107. Specifically, the touch signal line 107 is disposed in the main pixel area 103 and the subpixel area 104 For example, the touch signal line 107 may be disposed on a side of the data signal line 100 and run through the main pixel area 103 and the subpixel area 104.

In the embodiment of the present invention, when setting the touch signal line 107, a width of the touch signal line 107 may be less than a width of the scan signal line 101, and the touch signal line 107 is arranged in parallel with the data signal line 100. Further, the touch signal line 107 is also electrically connected to the pixel electrode 340 in the main pixel area 103 and the capacitor electrode in the subpixel area 104. In the embodiment of the present invention, when setting the touch signal line 107, the touch signal line 107 is correspondingly arranged in the main pixel area 103 and the subpixel area 104. For example, when the touch signal line 107 is directly arranged at a central position of each of the main pixel area 103 and the subpixel area 104, there is no need to arrange the touch signal line at an edge position of the pixel area, so that an aperture size of the pixel area and an arrangement of the touch signal line are improved, thus effectively simplifying a layout structure of each circuit on the array substrate, and improving an aperture ratio in the pixel area.

In the embodiment of the present invention, when the above-mentioned touch signal line 107 is disposed, the touch signal line 107 can be correspondingly arranged at corresponding positions above the trunk electrodes. Specifically, the touch signal line 107 can be correspondingly disposed on a central axis OO' where the trunk electrodes are located to rectify as much as possible the situation that light is blocked by the touch signal line 107, thus effectively improving the touch effect of the display panel. Preferably, the width of the touch signal line 107 may be less than a width of the main electrode. Further, the pixel electrodes in different areas can also be arranged into other patterned structures. In this case, the touch signal line 107 should be disposed along the main electrode as much as possible and arranged over the central axis OO' corresponding to the pixel electrodes in the main pixel area and the subpixel area, so as to prevent the light from being blocked by the touch signal line, thereby improving the comprehensive performance of the display panel. Further, in the embodiment of the present application, the touch signal line 107 is further electrically connected to the common electrode 3201 and the capacitor electrode 320 through corresponding via holes, so as to achieve the transmission of the touch signal.

Figure 6:
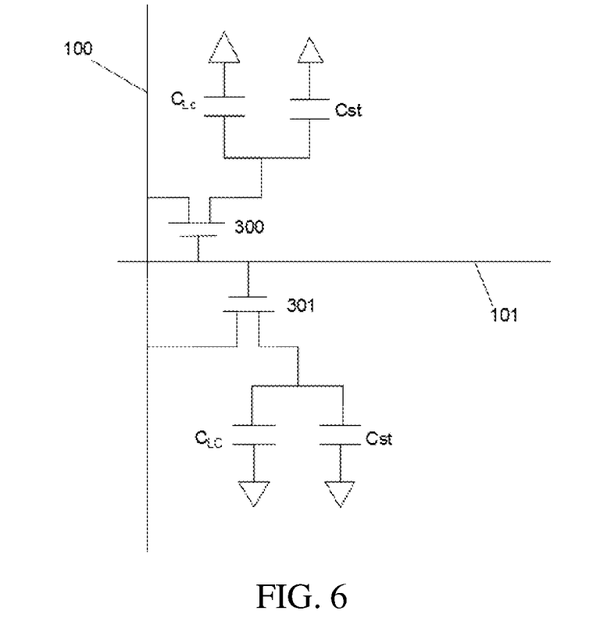
FIG. 6 is a schematic structural view of a driving circuit corresponding to a pixel unit according to an embodiment of the present invention.

Further, in the embodiment of the present application, as shown in FIG. 6, FIG. 6 is a schematic structural view of a driving circuit corresponding to a pixel unit according to an embodiment of the present invention. Specifically, the driving circuit corresponds to the wiring structure in FIG. 3. The driving circuit includes the first thin-film transistor 300 and the second thin-film transistor 301. Specifically, the first thin-film transistor 300 and the second thin-film transistor 301 in the driving circuit are corresponding to thin-film transistors in the main pixel area and the subpixel area in FIG. 2, respectively.

Specifically, a gate of the first thin-film transistor 300 is electrically connected to a gate of the second thin-film transistor 301 and is also electrically connected to the scan signal line 101. In addition, an electrode terminal of each of the first thin-film transistor 300 and the second thin-film transistor 301 is electrically connected to the data signal line 100. The other electrode end of each of the first thin-film transistor 300 and the second thin-film transistor 301 is electrically connected to one end of an equivalent capacitance in the corresponding pixel area. In the embodiment of the present invention, a storage capacitor Cst may be an equivalent capacitor formed between the touch signal line and a corresponding electrode layer.

In the embodiment of the present invention, since the capacitor electrode is disposed in the subpixel area, the capacitance values of the storage capacitors Cst equivalently formed in the main pixel area and the subpixel area are different. In addition, in the subpixel area, a capacitance value of the storage capacitor Cst is greater than an equivalent value of the storage capacitor Cst in the main pixel area. Therefore, in the embodiment of the present invention, the charging rates of the first thin-film transistor 300 and the second thin-film transistor 301 are different, thereby effectively adjusting the display viewing angles of the touch display panel. In addition, in the subpixel area, since the area of the capacitor electrode is relatively large, the touch sensitivity and the touch effect of the touch display panel are effectively improved.

Figure 7:
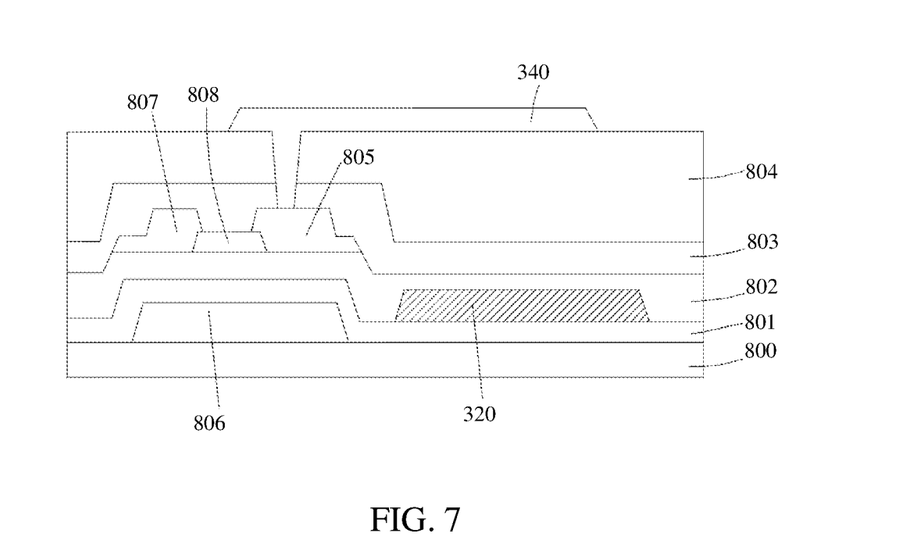
FIG. 7 is a schematic view of a film layer structure corresponding to a touch display panel according to an embodiment of the present invention.

Further, as shown in FIG. 7, FIG. 7 is a schematic view of a film layer structure corresponding to a touch display panel according to an embodiment of the present invention. Referring to FIGS. 3 to 6 together with FIG. 7, in the embodiment of the present invention, the touch display panel includes a substrate 800, a first passivation layer 801, the capacitor electrode 320, a gate insulating layer 802, a second passivation layer 803, and a planarization layer 804.

Specifically, the first passivation layer 801 is disposed on the substrate 800, the capacitor electrode 320 is disposed on the first passivation layer 801, and the gate insulating layer 802 is disposed on the first passivation layer 801 and completely covers the capacitor electrode 320. Further, the second passivation layer 803 is disposed on the gate insulating layer 802, and the planarization layer 804 is disposed on the second passivation layer 803.

Preferably, in the embodiment of the present invention, the touch display panel is further provided with a thin-film transistor. The thin-film transistor of the touch display panel is provided corresponding to the thin-film transistor in the subpixel area in the embodiment of the present invention. Specifically, the thin-film transistor includes a gate 806, a source electrode 807, a drain electrode 805, and an active layer 808. The gate 806 is correspondingly disposed on the substrate 800, and the first passivation layer 801 completely covers the gate 806. In this case, the source electrode 807 and the drain electrode 805 are electrically connected to the active layer 808 of the thin-film transistor and are correspondingly disposed on the gate insulating layer 802. In the embodiment of the present application, when arranging the source electrode 807, the drain electrode 805, and the active layer 808, the source electrode 807 and the drain electrode 805 can be directly disposed on both sides of the active layer 808 and are correspondingly electrically connected to the active layer 808.

In the embodiment of the present application, when arranging the capacitor electrode 320 and the gate electrode 806 of the thin-film transistor, the capacitor electrode 320 can be arranged on one side of the gate electrode 806, and an orthographic projection of the capacitor electrode 320 on the array substrate does not overlap the gate of the thin-film transistor. As in a same horizontal plane, the capacitor electrode 320 is disposed away from the gate 806, thereby reducing the problem of mutual interference between different capacitors, and effectively improving reliability and comprehensive performance of the touch display panel.

Further, the touch display panel further includes a pixel electrode 340, and the pixel electrode 340 is disposed on the planarization layer 804. In this case, the pixel electrode 340 is electrically connected to the drain electrode 805 of the thin-film transistor through a corresponding via structure, so as to achieve the driving and control of the pixel electrode 340.

In the embodiment of the present invention, since the capacitor electrode 320 is provided, the capacitor electrode 320 and the pixel electrode 340 are located on different film layers, respectively. Specifically, the capacitor electrode 320 may be disposed on a bottommost layer of the touch display panel, such as directly disposed on the substrate 800. Alternatively, the capacitor electrode 320 and the gate electrode 806 of the thin-film transistor are arranged in a same layer.

Further, the touch display panel further includes a touch signal line. In the embodiment of the present invention, when disposing the touch signal line, the touch signal line can be disposed in a same layer as the source electrode 807 and the drain electrode 805 of the thin-film transistor, thereby effectively simplifying a film layer fabrication process of the touch display panel. In the embodiment of the present invention, the touch signal line, the capacitor electrode, and the pixel electrodes arranged in the pixel unit can be made of transparent metal materials, so as to reduce shading of light and to improve the light transmittance and the touch effect.

In the embodiment of the present invention, by arranging the capacitor electrode in the subpixel area, and the orthographic projection of the capacitor electrode on the substrate at least partially overlaps the orthographic projection of the subpixel electrode on the substrate, the capacitance value of the storage capacitor in the subpixel area is increased, thus effectively improving the touch precision and the touch effect of the touch display panel. Further, in the embodiment of the present invention, the layout structure and position of the touch signal line are changed, thereby effectively simplifying the pixel driving circuit and the corresponding wiring structure.

Preferably, the touch display panel further includes a color filter substrate, a liquid crystal layer, and a touch layer. Specifically, the touch layer is arranged on an array substrate, and the color filter substrate is arranged opposite to the array substrate, the liquid crystal layer is disposed between the array substrate and the color filter substrate, and liquid crystals are disposed in the liquid crystal layer. The liquid crystals are deflected under an action of corresponding electrodes, making the display panel display brightness. Furthermore, the array substrate in the touch display panel is the array substrate provided in the embodiment of the present invention. The touch display panel has better touch precision and touch effects, and an arrangement of an internal structure of the touch display panel is more reasonable, thus improving the comprehensive performance.

Further, an embodiment of the present invention further provides a touch display device. Specifically, the touch display device includes the touch display panel provided in the embodiment of the present invention, and the touch display panel may be an in-cell touch display panel. The touch display device can be any product or component with display functions and touch functions, such as mobile phones, computers, electronic paper, monitors, notebook computers, digital photo frames, etc. The specific type thereof is not specifically limited.

The array substrate and the touch display panel provided by the embodiments of the present invention are described in detail above. Specific embodiments are used in this paper to illustrate the principles and implementations of the present invention, and the descriptions of the above embodiments are only used to help understand the technical solutions and kernel ideas of the present invention; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present invention.

What is claimed is:

1. An array substrate, comprising:
   a substrate;
   a pixel unit disposed on the substrate and comprising a main pixel area, a subpixel area, a pixel electrode, a capacitor electrode, and a common electrode, wherein the main pixel area is arranged on at least one side of the subpixel area;
   wherein the pixel electrode comprises a main pixel electrode and a subpixel electrode, and the main pixel electrode is disposed in the main pixel area and the subpixel electrode is disposed in the subpixel area; the main pixel electrode comprises a first trunk electrode and a first branch electrode, the subpixel electrode comprises a second trunk electrode and a second branch electrode; and
   a touch signal line disposed in the main pixel area and the subpixel area and electrically connected to the capacitor electrode and the common electrode, wherein the touch signal line is arranged above the first trunk electrode and the second trunk electrode, and the touch signal line extends in parallel with the first trunk electrode and the second trunk electrode, a width of the touch signal line is less than a width of the first trunk electrode and the second trunk electrode;
   wherein the capacitor electrode is arranged in the subpixel area, the common electrode is arranged in the main pixel area, an orthographic projection of the capacitor electrode on the substrate at least partially overlaps an orthographic projection of the subpixel electrode on the substrate, and a capacitance value of a storage capacitor corresponding to the subpixel electrode and the capacitor electrode is greater than a capacitance value of a storage capacitor corresponding to the main pixel electrode and the common electrode;
   wherein an overlapping area between the capacitor electrode and the subpixel electrode is greater than an overlapping area between the main pixel electrode and the common electrode.

2. The array substrate of claim 1, wherein an area of the orthographic projection of the capacitor electrode on the substrate is larger than an area of the orthographic projection of the subpixel electrode in the subpixel area on the substrate.

3. The array substrate of claim 1, wherein each of the main pixel electrode and the subpixel electrode has a patterned configuration.

4. The array substrate of claim 3, wherein the capacitor electrode has a patterned configuration, which is different from that of the subpixel electrode.

5. The array substrate of claim 4, wherein the capacitor electrode comprises a plurality of first slits, the subpixel electrode comprises a plurality of second slits, wherein at least some of the first slits are misaligned with the second slits.

6. The array substrate of claim 1, wherein the capacitor electrode comprises a first electrode plate and a second electrode plate disposed on a side of the first electrode plate, wherein the first electrode plate and the second electrode plate are symmetrically arranged relative to a central axis of the subpixel area.

7. The array substrate of claim 6, wherein the first electrode plate receives a first voltage signal, and the second electrode plate receives a second voltage signal, wherein the first voltage signal is same as the second voltage signal.

8. The array substrate of claim 1, wherein the touch signal line is located on a side of the data signal line and is correspondingly disposed on a central axis of the main pixel area and a central axis of the subpixel area.

9. The array substrate of claim 1, wherein the pixel unit further comprises a plurality of scan signal lines arranged in a first direction, and a plurality of data signal lines arranged in a second direction intersecting the first direction;
   wherein the main pixel area and the subpixel area are correspondingly arranged on both sides of each of the scan signal lines.

10. The array substrate of claim 1, wherein the common electrode is arranged around the main pixel electrode.

11. The array substrate of claim 10, wherein the capacitor electrode and a gate included in a thin-film transistor are disposed in a same layer.

12. A touch display panel, comprising an array substrate, wherein the array substrate comprises:
    a substrate;
    a pixel unit disposed on the substrate and comprising a main pixel area, a subpixel area, a pixel electrode, a capacitor electrode, and a common electrode, wherein the main pixel area is arranged on at least one side of the subpixel area;
    wherein the pixel electrode comprises a main pixel electrode and a subpixel electrode, and the main pixel electrode is disposed in the main pixel area, and the subpixel electrode is disposed in the subpixel area; the main pixel electrode comprises a first trunk electrode and a first branch electrode, the subpixel electrode comprises a second trunk electrode and a second branch electrode; and
    a touch signal line disposed in the main pixel area and the subpixel area and electrically connected to the capacitor electrode and the common electrode, wherein the touch signal line is arranged above the first trunk electrode and the second trunk electrode, and the touch signal line extends in parallel with the first trunk electrode and the second trunk electrode, a width of the touch signal line is less than a width of the first trunk electrode and the second trunk electrode;

wherein the capacitor electrode is arranged in the subpixel area, the common electrode is arranged in the main pixel area, an orthographic projection of the capacitor electrode on the substrate at least partially overlaps an orthographic projection of the subpixel electrode on the substrate, and a capacitance value of a storage capacitor corresponding to the subpixel electrode and the capacitor electrode is greater than a capacitance value of a storage capacitor corresponding to the main pixel electrode and the common electrode;

wherein an overlapping area between the capacitor electrode and the subpixel electrode is greater than an overlapping area between the main pixel electrode and the common electrode.

13. The touch display panel of claim 12, wherein an area of the orthographic projection of the capacitor electrode on the substrate is larger than an area of the orthographic projection of the subpixel electrode in the subpixel area on the substrate.

14. The touch display panel of claim 12, wherein each of the main pixel electrode and the subpixel electrode has a patterned configuration.

15. The touch display panel of claim 12, wherein the capacitor electrode comprises a first electrode plate and a second electrode plate disposed on a side of the first electrode plate, wherein the first electrode plate and the second electrode plate are symmetrically arranged relative to a central axis of the subpixel area.

* * * * *